(12) United States Patent
Tanabe

(10) Patent No.: US 12,389,615 B2
(45) Date of Patent: Aug. 12, 2025

(54) SEMICONDUCTOR DEVICE

(71) Applicant: DENSO CORPORATION, Kariya (JP)

(72) Inventor: Hiromitsu Tanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 619 days.

(21) Appl. No.: 17/695,961

(22) Filed: Mar. 16, 2022

(65) Prior Publication Data
US 2022/0310830 A1   Sep. 29, 2022

(30) Foreign Application Priority Data

Mar. 24, 2021   (JP) .................. 2021-049874

(51) Int. Cl.
| | | |
|---|---|---|
| H10D 12/00 | (2025.01) | |
| H10D 8/00 | (2025.01) | |
| H10D 62/10 | (2025.01) | |
| H10D 62/17 | (2025.01) | |

(52) U.S. Cl.
CPC .......... H10D 12/481 (2025.01); H10D 8/411 (2025.01); H10D 62/127 (2025.01); H10D 62/393 (2025.01)

(58) Field of Classification Search
CPC ... H01L 21/8234; H01L 27/06; H01L 27/088; H01L 29/0603
See application file for complete search history.

(56) References Cited

U.S. PATENT DOCUMENTS

| | | |
|---|---|---|
| 2007/0170549 A1 | 7/2007 | Tsuzuki et al. |
| 2014/0048847 A1 | 2/2014 | Yamashita et al. |
| 2017/0098700 A1 | 4/2017 | Yamashita et al. |
| 2018/0374947 A1 | 12/2018 | Yamashita et al. |

FOREIGN PATENT DOCUMENTS

JP   WO2021045116 A1 *   3/2021   ......... H01L 21/8234

OTHER PUBLICATIONS

WO2021045116A1 (Year: 2021).*

* cited by examiner

*Primary Examiner* — Karen Kusumakar
(74) *Attorney, Agent, or Firm* — Posz Law Group, PLC

(57) ABSTRACT

In an IGBT region of a semiconductor device, a barrier region is disposed above a drift layer, and a contact trench is disposed between adjacent gate trenches in a semiconductor substrate. A first electrode is embedded in the contact trench. A connecting region is disposed between a bottom surface of the contact trench and the barrier region, and is connected to the barrier region and the first electrode. Further, the emitter region and the contact region are arranged in a direction different from an arrangement direction of the gate trenches. Thus, the semiconductor device can be miniaturized.

8 Claims, 15 Drawing Sheets

SEMICONDUCTOR DEVICE

CROSS REFERENCE TO RELATED APPLICATION

The present application claims the benefit of priority from Japanese Patent Application No. 2021-049874 filed on Mar. 24, 2021. The entire disclosures of the above application are incorporated herein by reference.

TECHNICAL FIELD

The present disclosure relates to a semiconductor device in which an insulated gate bipolar transistor (hereinafter referred to as an IGBT) element having an insulated gate structure and a free wheel diode (hereinafter referred to as FWD) element are formed on a common semiconductor substrate.

BACKGROUND

As a switching element used in an inverter or the like, for example, there is a semiconductor device in which an IGBT region having an IGBT element and an FWD region having an FWD element are formed on a common semiconductor substrate.

SUMMARY

The present disclosure describes a semiconductor device in which an IGBT region having an IGBT element and an FWD region having an FWD element are formed on a common semiconductor substrate. In the IGBT region of the semiconductor device, a barrier region is disposed above a drift layer, and a contact trench is disposed between adjacent gate trenches in a semiconductor substrate. A first electrode is embedded in the contact trench. A connecting region is disposed between a bottom surface of the contact trench and the barrier region, and is connected to the barrier region and the first electrode. Further, the emitter region and the contact region are arranged in a direction different from an arrangement direction of the gate trenches. Thus, the semiconductor device can be miniaturized.

BRIEF DESCRIPTION OF THE DRAWINGS

Objects, features and advantages of the present disclosure will become more apparent from the following detailed description made with reference to the accompanying drawings, in which.

DETAILED DESCRIPTION

Figure 1:
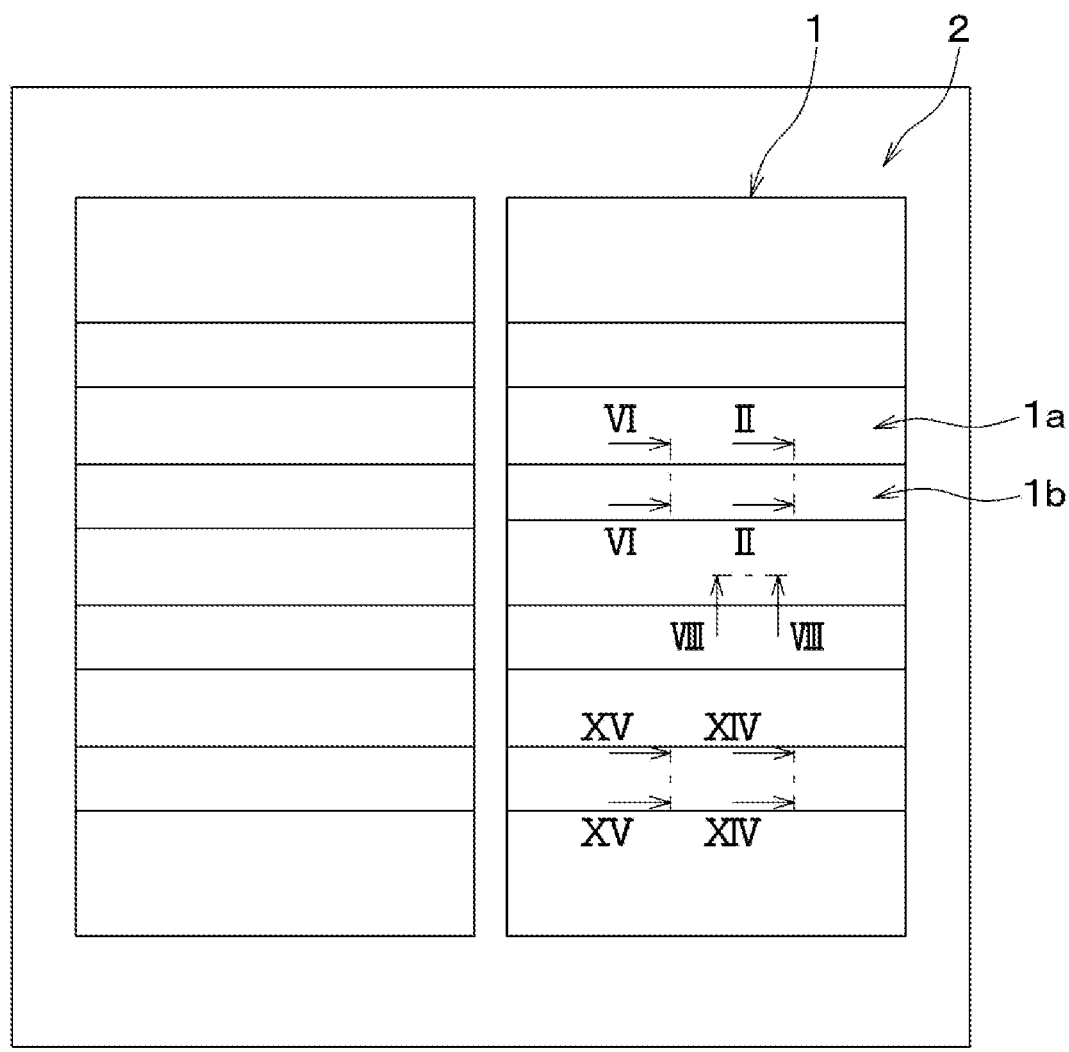
FIG. 1 is a plan view of a semiconductor device according to a first embodiment of the present disclosure.

To begin with, a relevant technology will be described only for understanding the embodiments of the present disclosure.

In a semiconductor device, an IGBT region having an IGBT element and an FWD region having an FWD element are formed on a common semiconductor substrate.

In such a semiconductor device, for example, a base layer is disposed adjacent to a first surface of a semiconductor substrate constituting an $n^-$ type drift layer, and a plurality of gate trenches are disposed so as to penetrate the base layer. Each of the gate trenches is extended in one direction along a planar direction of the semiconductor substrate as a longitudinal direction. In each of the gate trenches, a gate insulating film and a gate electrode are sequentially formed.

Further, an n type barrier region is disposed on the drift layer along the planar direction of the semiconductor substrate. The barrier region is disposed at the interface between the drift layer and the base layer, or at a portion in the base layer adjacent to the drift layer.

In a surface layer portion of the base layer, an $n^+$ type emitter region is disposed so as to be in contact with the gate trench, and a $p^+$ type contact region having a higher impurity concentration than the base layer is disposed. Further, an n type pillar region is disposed in the base layer so as to reach the barrier region. Specifically, the emitter region and the contact region are disposed between adjacent gate trenches in a manner that the emitter region is in contact with each gate trench, and the contact region is located opposite to the gate trench with respect to the emitter region. That is, the emitter region and the contact region are arranged in an arrangement direction of the plurality of gate trenches. The pillar region is disposed so as to penetrate the contact region and reach the barrier region.

An upper electrode is disposed adjacent to the first surface of the semiconductor substrate so as to be connected to the emitter region, the contact region, and the barrier region. A $p^+$ type collector layer and an $n^+$ type cathode layer are disposed adjacent to a second surface of the semiconductor substrate. Further, a lower electrode is disposed on the second surface of the semiconductor substrate to be electrically connected to the collector layer and the cathode layer.

In such a semiconductor device, a region in which the collector layer is disposed on the second surface of the semiconductor substrate serves as an IGBT region, and a region in which the cathode layer is disposed on the second surface of the semiconductor substrate serves as an FWD region. Since the FWD region is configured as described above, the FWD element is provided with an FWD element having a PN junction, which is formed by the n type cathode layer, the n type drift layer, and the p type base layer.

In the semiconductor device described above, however, the contact region and the emitter region are arranged side by side in the arrangement direction of the gate trenches. Therefore, it is difficult to narrow the distance between adjacent gate trenches, and it is difficult to miniaturize the semiconductor device.

The present disclosure provides a semiconductor device capable of miniaturization.

In a semiconductor device according to an aspect of the present disclosure, a semiconductor substrate includes an IGBT region having an IGBT element and a FWD region having an FWD element. The semiconductor substrate has a first conductivity type drift layer, a second conductivity type base layer disposed on the drift layer, a second conductivity type collector layer disposed opposite to the base layer with respect to the drift layer in the IGBT region, and a first conductivity type cathode layer disposed opposite to the base layer with respect to the drift layer in the FWD region. The semiconductor substrate has a first surface adjacent to the base layer and a second surface opposite to the first surface and adjacent to the collector layer and the cathode layer. A gate insulating film is disposed on a wall surface of each of a plurality of gate trenches disposed in the semiconductor substrate in the IGBT region. In the semiconductor substrate, the plurality of gate trenches are arranged in an arrangement direction. Each of the plurality of gate trenches passes through the base layer to reach the drift layer and extends in one direction as a longitudinal direction along a planar direction of the semiconductor substrate. A gate electrode is disposed on the gate insulating film. A first conductivity type emitter region, which has a higher impurity concentration than the drift layer, is disposed in a surface layer portion of the base layer in the IGBT region to be in contact with each of the gate trenches. A second conductivity type contact region, which has a higher impurity concentration than the base layer, is disposed in the base layer in the IGBT region. A first electrode is disposed adjacent to the first surface of the semiconductor substrate, and is electrically connected to the base layer and the emitter region. A second electrode is disposed adjacent to the second surface of the semiconductor substrate, and is electrically connected to the collector layer and the cathode layer. A first conductivity type barrier region, which has a higher impurity concentration than the drift layer, is disposed above the drift layer in the IGBT region. Further, the semiconductor substrate is formed with a contact trench between the adjacent gate trenches in the IGBT region, and the contact trench has a bottom surface adjacent to the first surface of the semiconductor substrate than the barrier region. The first electrode is embedded in the contact trench. In addition, a first conductivity type connecting region is disposed between the bottom surface of the contact trench and the barrier region in the IGBT region. The connecting region has a higher impurity concentration than the drift layer, and is connected to the barrier region and the first electrode. The emitter region and the contact region are arranged in a direction different from the arrangement direction of the gate trenches.

In such a configuration, the emitter region and the contact region are arranged in a direction different from the arrangement direction of the gate trenches. Therefore, the distance between the adjacent gate trenches can be easily narrowed, as compared with the configuration in which the emitter region and the contact region are arranged in the arrangement direction of the gate trenches. Accordingly, miniaturization of the semiconductor device can be achieved.

Hereinafter, embodiments of the present disclosure will be described with reference to the drawings. In the embodiments described hereinafter, the same or equivalent parts are designated with the same reference numerals.

First Embodiment

A first embodiment will be described with reference to the drawings. For example, a semiconductor device according to the present embodiment is suitably used as a power switching element used in power supply circuits such as inverters or DC/DC converters.

As shown in FIG. 1, the semiconductor device includes cell regions 1 and an outer peripheral region 2 surrounding the cell regions 1. In the present embodiment, the semiconductor device has two cell regions 1. Each of the cell regions 1 is provided with an IGBT region 1a that functions as an IGBT element and an FWD region 1b that functions as an FWD element. That is, the semiconductor device of the present embodiment is a reverse conducting insulated gate bipolar transistor (RC-IGBT) in which an IGBT region 1a and an FWD region 1b are formed in the same chip.

In the present embodiment, the IGBT regions 1a and the FWD regions 1b are alternately arranged in one direction in each of the cell regions 1. That is, the IGBT regions 1a and the FWD regions 1b are alternately arranged in one direction, the one direction being included in the plane of the semiconductor substrate 10 as will be described later. Specifically, each of the IGBT region 1a and the FWD region 1b is a rectangular region having a longitudinal direction, and the IGBT regions 1a and the FWD regions 1b are alternately arranged in the one direction as an arrangement direction so that the longitudinal direction of each of the IGBT regions 1a and the FWD regions 1b intersects with the arrangement direction. Further, the IGBT regions 1a and the FWD regions 1b are alternately arranged so that the IGBT regions 1a are located at both ends in the arrangement direction.

As shown in FIG. 1, the IGBT regions 1a and the FWD regions 1b each have the rectangular shape defining the longitudinal direction in a left and right direction of FIG. 1, and are arranged alternately in an up and down direction in FIG. 1 as the arrangement direction. Further, as will be described in detail later, in the present embodiment, the IGBT region 1a is a region provided above a collector layer 25, and the FWD region 1b is a region provided above a cathode layer 26.

Figure 2:
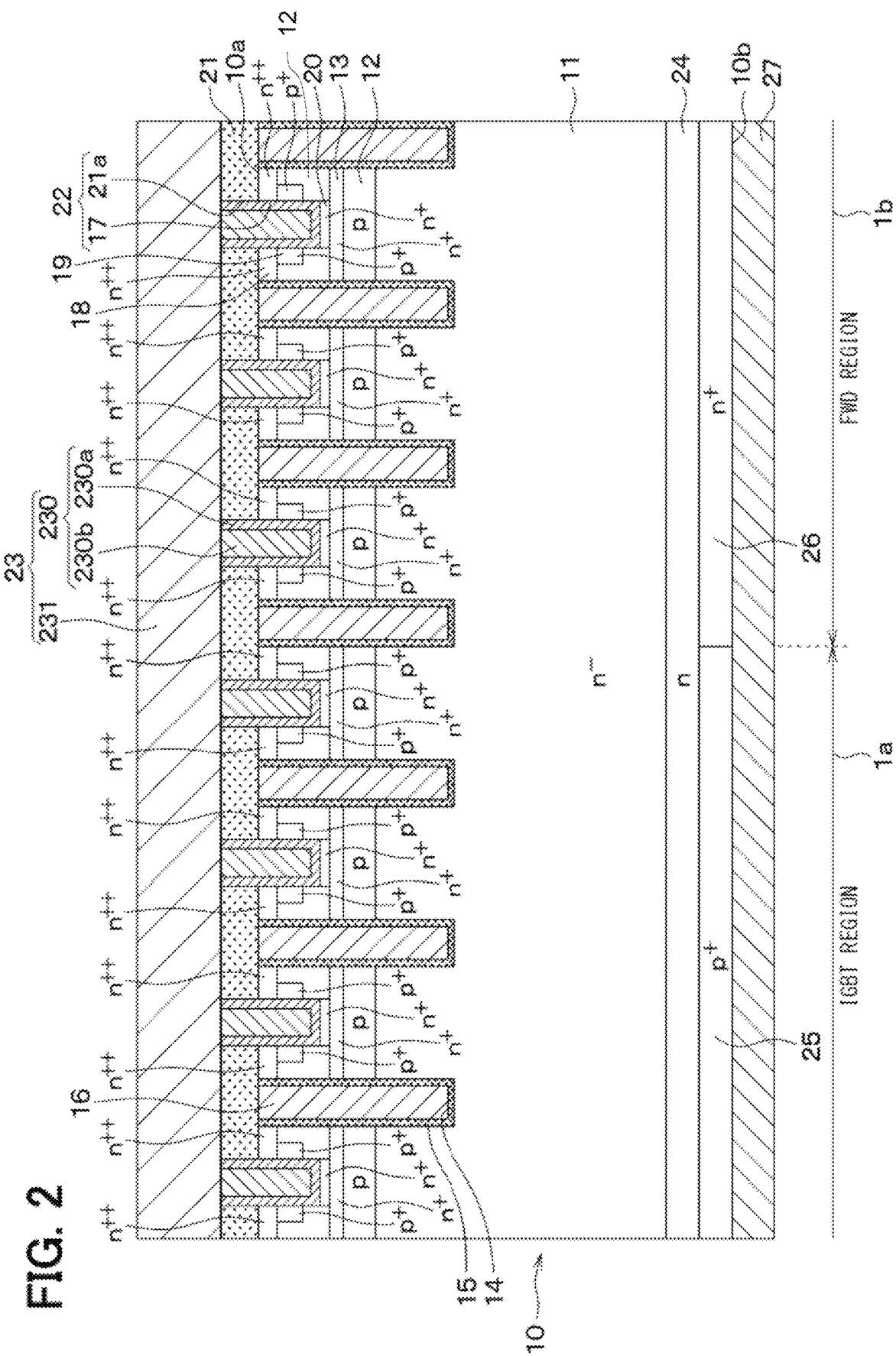
FIG. 2 is a cross-sectional view of the semiconductor device taken along a line II-II shown in FIG. 1.

As shown in FIG. 2, the semiconductor device includes a semiconductor substrate 10 having an n⁻ type drift layer 11. The semiconductor substrate 10 is made of a silicon substrate. The semiconductor substrate has a p type base layer 12 above the drift layer 11. In the following description, the surface of the semiconductor substrate 10 on the base layer 12 side will be referred to as a first surface 10a of the semiconductor substrate 10, and the surface of the semiconductor substrate 10 opposite to the first surface 10a and on the drift layer 11 side will be referred to as a second surface 10b of the semiconductor substrate 10. In the semiconductor device of the present embodiment, the IGBT region 1a and the FWD region 1b have the same configuration on the first surface 10a side of the semiconductor substrate 10.

An $n^+$ type barrier region 13 having a higher impurity concentration than the drift layer 11 is disposed in a portion of the base layer 12 adjacent to the drift layer 11. In the present embodiment, the barrier region 13 is disposed entirely along the planar direction of the semiconductor substrate 10. In the following description, the barrier region 13 is exemplarily formed in the portion of the base layer 12 adjacent to the drift layer 11. As another example, the barrier region 13 may be formed at the interface between the drift layer 11 and the base layer 12.

A plurality of gate trenches 14 are formed in the semiconductor substrate 10 so as to extend in a depth direction from the first surface 10a and reach the drift layer 11 while passing through the base layer 12 and the barrier region 13. As a result, the base layer 12 and the barrier region 13 are separated into plural parts by the gate trenches 14. In the present embodiment, the plurality of gate trenches 14 are disposed in the IGBT region 1a and the FWD region 1b, respectively. Further, the plurality of gate trenches 14 are formed in a striped shape. Each of the gate trenches 14 has a longitudinal direction in one direction intersecting the arrangement direction of the IGBT regions 1a and the FWD regions 1b. That is, each gate trench 14 has a striped shape extending in a direction normal to the paper surface of FIG. 2 as the longitudinal direction.

Each gate trench 14 is filled with a gate insulating film 15 and a gate electrode 16. The gate insulating film 15 is disposed so as to cover the wall surface of the gate trench 14. The gate electrode 16 is made of polysilicon or the like, and is embedded on the gate insulating film 15 in the gate trench 14. In this way, a trench gate structure is formed.

Further, a contact trench 17 is formed between the adjacent gate trenches 14 in the semiconductor substrate 10. The contact trench 17 is formed on the first surface 10a side of the semiconductor substrate 10. In the present embodiment, the contact trench 17 is extended in the longitudinal direction of the gate trench 14. The contact trench 17 is disposed shallower than the gate trench 14 and is disposed so as not to reach the barrier region 13. That is, the contact trench 17 is disposed so as not to expose the barrier region 13 from its bottom surface.

In the surface layer portion of the base layer 12, an $n^{++}$ type emitter region 18 and a $p^+$ type contact region 19 are formed. The $n^{++}$ type emitter region 18 has a higher impurity concentration than the drift layer 11 and the barrier region 13, and the $p^+$ type contact region 19 has a higher impurity concentration than the base layer 12. In the present embodiment, the emitter region 18 is extended in the longitudinal direction of the gate trench 14, and is exposed from the first surface 10a of the semiconductor substrate 10. The emitter region 18 is disposed so as to be in contact with the side surface of the gate trench 14 and the side surface of the contact trench 17. In addition, the emitter region 18 is disposed so as to be terminated within the base layer 12. The contact region 19 is disposed between the emitter region 18 and the barrier region 13, and is in contact with the side surface of the contact trench 17. In the present embodiment, therefore, the emitter region 18 and the contact region 19 are arranged in a thickness direction of the semiconductor substrate 10. Note that the contact region 19 of the present embodiment is not formed below a portion of the emitter region 18, the portion being in contact with the gate trench 14. That is, a portion of the base layer 12 is arranged between the side surface of the gate trench 14 and the contact region 19. A portion of the base layer 12 being in contact with the side surface of the gate trench 14 serves as a region constituting a channel region.

An $n^+$ type connecting region 20 having a higher impurity concentration than the drift layer 11 is disposed between the bottom surface of the contact trench 17 and the barrier region 13. Specifically, the connecting region 20 is disposed so as to connect between the bottom surface of the contact trench 17 and the barrier region 13.

The contact region 19 and the connecting region 20 of the present embodiment are formed as follows. For example, after the contact trench 17 is formed, the contact region 19 is formed to be in contact with a side surface of the contact trench 17. In this case, the contact region 19 is formed, for example, by implanting ions in an oblique direction inclined relative to a normal direction to the first surface 10a of the semiconductor substrate 10. The connecting region 20 is formed, for example, by implanting ions into the bottom surface of the contact trench 17, after the contact trench 17 is formed.

An interlayer insulating film 21 is disposed on the first surface 10a of the semiconductor substrate 10. The interlayer insulation film 21 is made of borophosphosilicate glass (BPSG) or the like. The interlayer insulating film 21 is formed with a contact hole 21a communicating with the contact trench 17 formed in the semiconductor substrate 10. Hereinafter, the contact trench 17 and the contact hole 21a are collectively referred to as a connection trench 22. The contact hole 21a of the present embodiment has a shape corresponding to the contact trench 17, and is extended in the longitudinal direction of the gate trench 14, similarly to the contact trench 17. Therefore, the connection trench 22 of the present embodiment is in a state of being extended in the longitudinal direction of the gate trench 14.

An upper electrode 23 is formed on the interlayer insulating film 21. The upper electrode 23 is electrically connected to the emitter region 18, the contact region 19, and the connecting region 20 through the connecting trench 22. In the present embodiment, the upper electrode 23 has a connection electrode 230 that is embedded in the connection trench 22 and a main electrode 231 that is arranged on the interlayer insulating film 21 and connected to the connection electrode 230.

The connection electrode 230 of the present embodiment includes a barrier metal portion 230a and an embedded portion 230b. The barrier metal portion 230a is made of Ti/TiN or the like, and is formed along the wall surface of the contact trench 17. The embedded portion 230b is made of a tungsten plug or the like, and is formed on the barrier metal portion 230a. The main electrode 231 is made of aluminum or the like.

The upper electrode 23 is electrically connected to the emitter region 18 and the contact region 19 in a state of ohmic contact. Further, the upper electrode 23 is electrically connected to the connecting region 20 in a state of Schottky barrier junction. The upper electrode 23 functions as an emitter electrode in the IGBT region 1a and functions as an anode electrode in the FWD region 1b. In the present embodiment, the upper electrode 23 corresponds to a first electrode.

An n type field stop layer (hereinafter referred to as an FS layer) 24 having a higher impurity concentration than the drift layer 11 is disposed in a portion of the drift layer 11 on the opposite side to the base layer 12 with respect to the drift layer 11. That is, the FS layer 24 is disposed on a side adjacent to the second surface 10b of the semiconductor substrate 10.

In the IGBT region 1a, a p+ type collector layer 25 is disposed on the opposite side to the drift layer 11 with respect to the FS layer 24. In the FWD region 1b, an n+ type cathode layer 26 is disposed on the opposite side to the drift layer 11 with respect to the FS layer 24. In other words, the collector layer 25 and the cathode layer 26 are disposed adjacent to each other on the opposite side to the drift layer 11 with respect to the FS layer 24. The IGBT region 1a and the FWD region 1b are sectioned depending on whether the layer formed adjacent to the second surface 10b of the semiconductor substrate 10 is the collector layer 25 or the cathode layer 26. In the present embodiment, the region above the collector layer 25 serves as the IGBT region 1a, and the region above the cathode layer 26 serves as the FWD region 1b.

A lower electrode 27 is disposed on an opposite side to the drift layer 11 with respect to the collector layer 25 and the cathode layer 26. The lower electrode 27 is electrically connected to the collector layer 25 and the cathode layer 26. The lower electrode 27 serves as a collector electrode in the IGBT region 1a and serves as a cathode electrode in the FWD region 1b. In the present embodiment, the lower electrode 27 corresponds to a second electrode.

The semiconductor device of the present embodiment is configured as described above. As such, the IGBT region 1a constitutes an IGBT element including the base layer 12 as a base, the emitter region 18 as an emitter, and the collector layer 25 as a collector. Likewise, the FWD region 1b constitutes a FWD element with PN junction including the base layer 12 as an anode, the drift layer 11, the FS layer 24, and the cathode layer 26 as a cathode.

The configuration of the semiconductor device according to the present embodiment has been described above. In the present embodiment, the IGBT region 1a and the FWD region 1b are formed in the common semiconductor substrate 10 in this way. In the present embodiment, n type, n+ type, n++ type, and n− type correspond to a first conductivity type, and p type and p+ type correspond to a second conductivity type. Further, due to the configuration as described above, the semiconductor substrate 10 is configured to include the drift layer 11, the base layer 12, the barrier region 13, the emitter region 18, the contact region 19, the FS layer 24, the collector layer 25, the cathode layer 26, and the like.

Next, operations and effects of the semiconductor device described above will be described.

In the semiconductor device, when the lower electrode 27 is applied with a voltage higher than that of the upper electrode 23, the PN junction formed between the base layer 12 and the drift layer 11 is brought into a reverse conduction state to form a depletion layer. When the gate electrode 16 is applied with a low-level voltage (for example, 0 V) that is lower than a threshold voltage Vth of the insulated gate structure, a current does not flow between the upper electrode 23 and the lower electrode 27.

In order to turn the IGBT element to an on state, a high-level voltage, which is equal to or higher than the threshold voltage Vth of the insulated gate structure, is applied to the gate electrode 16 in a state where the lower electrode 27 is applied with the voltage higher than that of the upper electrode 23. As a result, a channel region, which is an inversion layer, is formed in a portion of the base layer 12 being in contact with the gate trench 14 in which the gate electrode 16 is arranged. Then, in the IGBT element, electrons are supplied from the emitter region 18 to the drift layer 11 via the channel region, so that holes are supplied from the collector layer 25 to the drift layer 11. As a result, as the resistance value of the drift layer 11 is lowered due to conductivity modulation, the IGBT element is turned to the on state.

In the present embodiment, the emitter region 18 and the contact region 19 are arranged in the thickness direction of the semiconductor substrate 10. Therefore, as compared with the configuration in which the emitter region 18 and the contact region 19 are arranged in the arrangement direction of the gate trenches 14, the distance between the adjacent gate trenches 14 can be easily reduced, and thus the holes are difficult to escape. As such, the holes are easily accumulated in the drift layer 11, and an injection enhancement (IE) effect can be improved, resulting in a reduction in the on-resistance.

In order to turn the IGBT element in an off state and to turn the FWD element in an on state (i.e., to operate the FWD element as a diode), the voltages applied to the upper electrode 23 and the lower electrode 27 are switched, and a forward voltage is applied so that the upper electrode 23 is applied with a voltage higher than that of the lower electrode 27. As a result, holes are supplied to the base layer 12 and electrons are supplied to the cathode layer 26, so that the FWD element operates as a diode.

In the present embodiment, the semiconductor device is provided with the barrier region 13 and the connecting region 20, and the connecting region 20 has the Schottky barrier junction with the upper electrode 23. When the FWD element is in the on state, the upper electrode 23 and the connecting region 20 (that is, the barrier region 13) are short-circuited, so that holes are less likely injected from the upper electrode 23 into the drift layer 11 via the contact region 19.

Thereafter, in order to switch the FWD element from the on state to the off state, a reverse voltage is applied so that the lower electrode 27 is applied with a voltage higher than that of the upper electrode 23. In other words, in order to cut off the current in the state where the forward current is flowing in the FWD element, a reverse voltage is applied so that the lower electrode 27 is applied with the higher voltage than the upper electrode 23. As a result, the FWD element is brought into a recovery state. The holes are attracted to the upper electrode 23 side and the electrons are attracted to the lower electrode 27 side, so the recovery current is generated.

In the semiconductor device of the present embodiment, as described above, the hole injection is suppressed when the FWD element is in the on state. Therefore, the recovery current can be reduced and thus recovery loss can be reduced.

According to the present embodiment described above, the upper electrode 23 has the Schottky barrier junction with the barrier region 13 via the connecting region 20. Therefore, when the FWD element is in the on state, since the upper electrode 23 and the connecting region 20 are short-circuited, it is less likely that the holes will be injected from the upper electrode 23 to the drift layer 11 via the contact region 19. As such, when the FWD element is turned off, the recovery current can be reduced and the recovery loss can be reduced.

In the case of the RC-IGBT, it is conceivable to reduce the impurity concentration of the contact region 19 and the base layer 12 in order to suppress the hole injection from the contact region 19 and the base layer 12 of the IGBT region 1a adjacent to the FWD region 1b. In such a configuration, however, another issue such as a decrease in breakdown capacity of the IGBT element or a decrease in threshold voltage may arise.

Therefore, the semiconductor device of the present embodiment, which can restrict the hole injection without reducing the impurity concentration of the contact region 19 and the base layer 12, can suppress the reduction of the breakdown capacity of the IGBT element while suppressing the recovery loss.

In the present embodiment, the emitter region 18 and the contact region 19 are arranged in the thickness direction of the semiconductor substrate 10. Therefore, the distance between the adjacent gate trenches 14 can be easily reduced, as compared with the configuration in which the emitter region 18 and the contact region 19 are arranged in the arrangement direction of the gate trenches 14. As such, it is possible to miniaturize the semiconductor device while reducing the on-resistance.

In the present embodiment, the barrier region 13 and the upper electrode 23 disposed in the contact trench 17 are connected via the connecting region 20. Therefore, as compared with the configuration in which the upper electrode 23 disposed in the contact trench 17 is directly connected to the barrier region 13, a connection failure between the upper electrode 23 and the barrier region 13 can be suppressed even if the depth of the contact trench 17 is deviated.

Second Embodiment

A second embodiment will be described hereinafter. In the present embodiment, the configuration of the FWD region 1b is modified from that of the first embodiment. The other configurations are the same as those of the first embodiment, and therefore a description of the same configurations will be omitted below.

Figure 3:
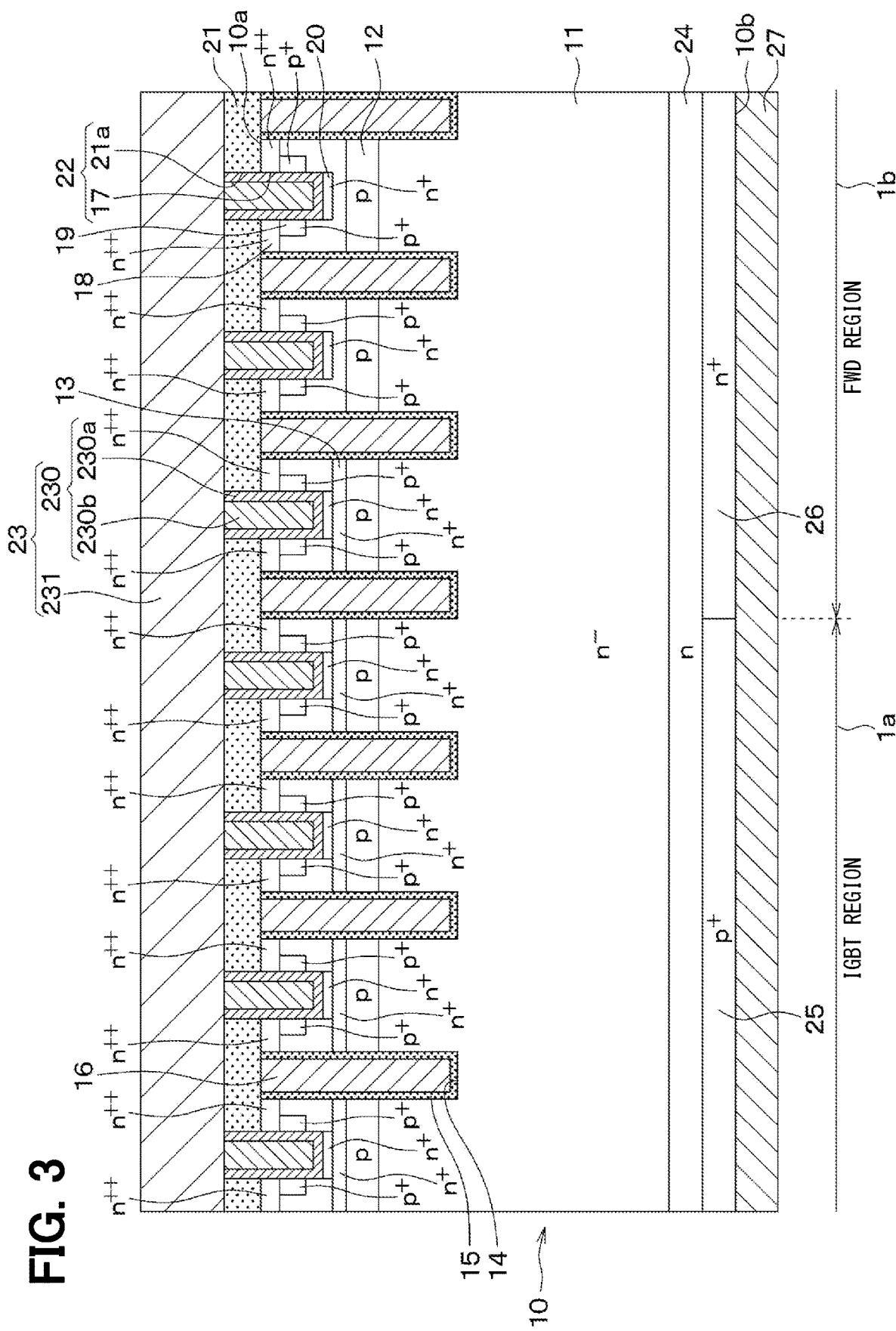
FIG. 3 is a cross-sectional view of a semiconductor device according to a second embodiment of the present disclosure.

In the semiconductor device of the present embodiment, as shown in FIG. 3, the barrier region 13 is partially formed in the FWD region 1b. In other words, the barrier region 13 is thinned out in the FWD region 1b. That is, the barrier region 13 is not formed entirely in the FWD region 1b along the planar direction of the semiconductor substrate 10. Note that FIG. 3 is a cross-sectional view taken along the line II-II in FIG. 1.

According to the present embodiment described above, the emitter region 18 and the contact region 19 are arranged in the thickness direction of the semiconductor substrate 10. Therefore, the same effect as that of the first embodiment can be obtained.

In addition, in the present embodiment, the barrier region 13 is thinned out in the FWD region 1b. Therefore, the hole injection is less suppressed in the FWD region 1b, as compared with the first embodiment described above. As such, according to the semiconductor device of the present embodiment, it is possible to suppress an increase in the forward voltage of the FWD element, as compared with the first embodiment described above. Note that the forward voltage of the FWD element can be reduced with an increase in the region where the barrier region 13 is thinned out. Therefore, in the FWD region 1b, it is preferable to adjust the ratio of thinning out the barrier region 13 according to the intended use.

Modification of Second Embodiment

Figure 4:
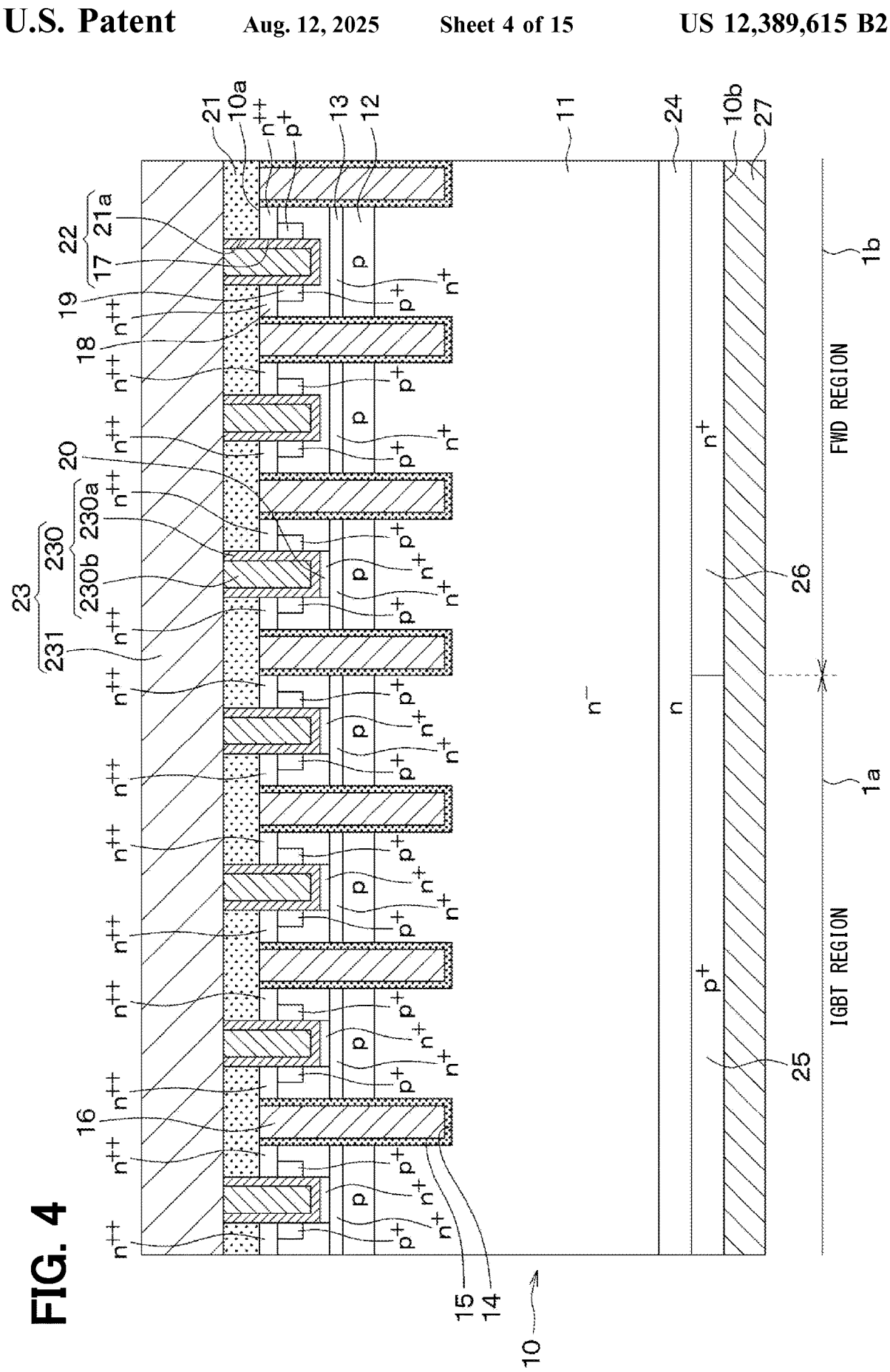
FIG. 4 is a cross-sectional view of a semiconductor device according to a modification of the second embodiment.

A modification of the second embodiment will be described hereinafter. In the modification of the second embodiment, as shown in FIG. 4, the barrier region 13 may be formed entirely in the FWD region 1b, and the connecting region 20 may be thinned out in the FWD region 1b. Even in such a semiconductor device, since the barrier region 13 is in a floating state in the region where the connecting region 20 is not formed, the similar effects to those of the second embodiment can be obtained.

Third Embodiment

A third embodiment will be described hereinafter. In the present embodiment, the arrangement of the emitter region 18 and the contact region 19 is changed from that of the first embodiment. The other configurations are the same as those of the first embodiment, and therefore a description of the same configurations will be omitted below.

Figure 5:
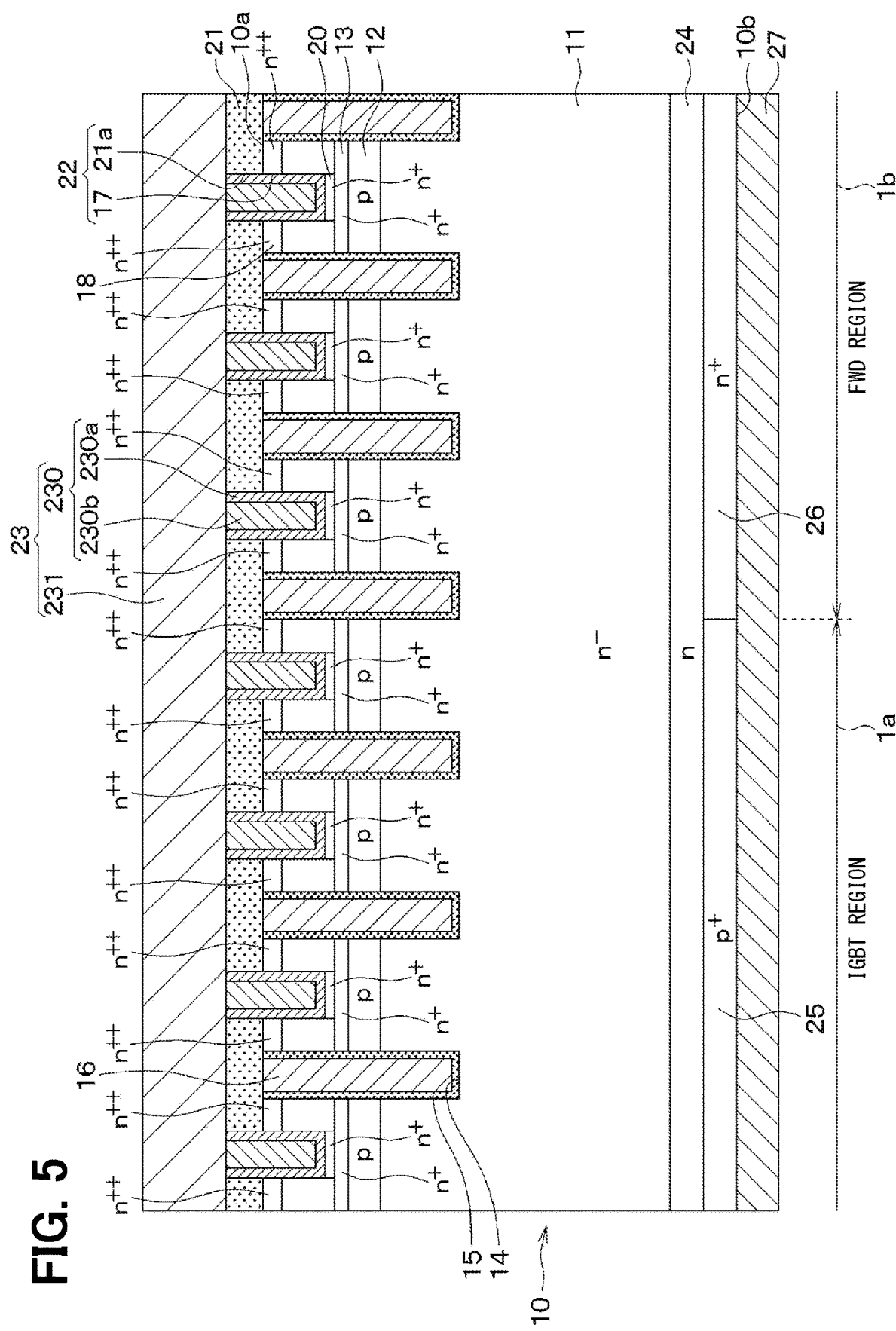
FIG. 5 is a cross-sectional view of a semiconductor device according to a third embodiment of the present disclosure.
Figure 6:
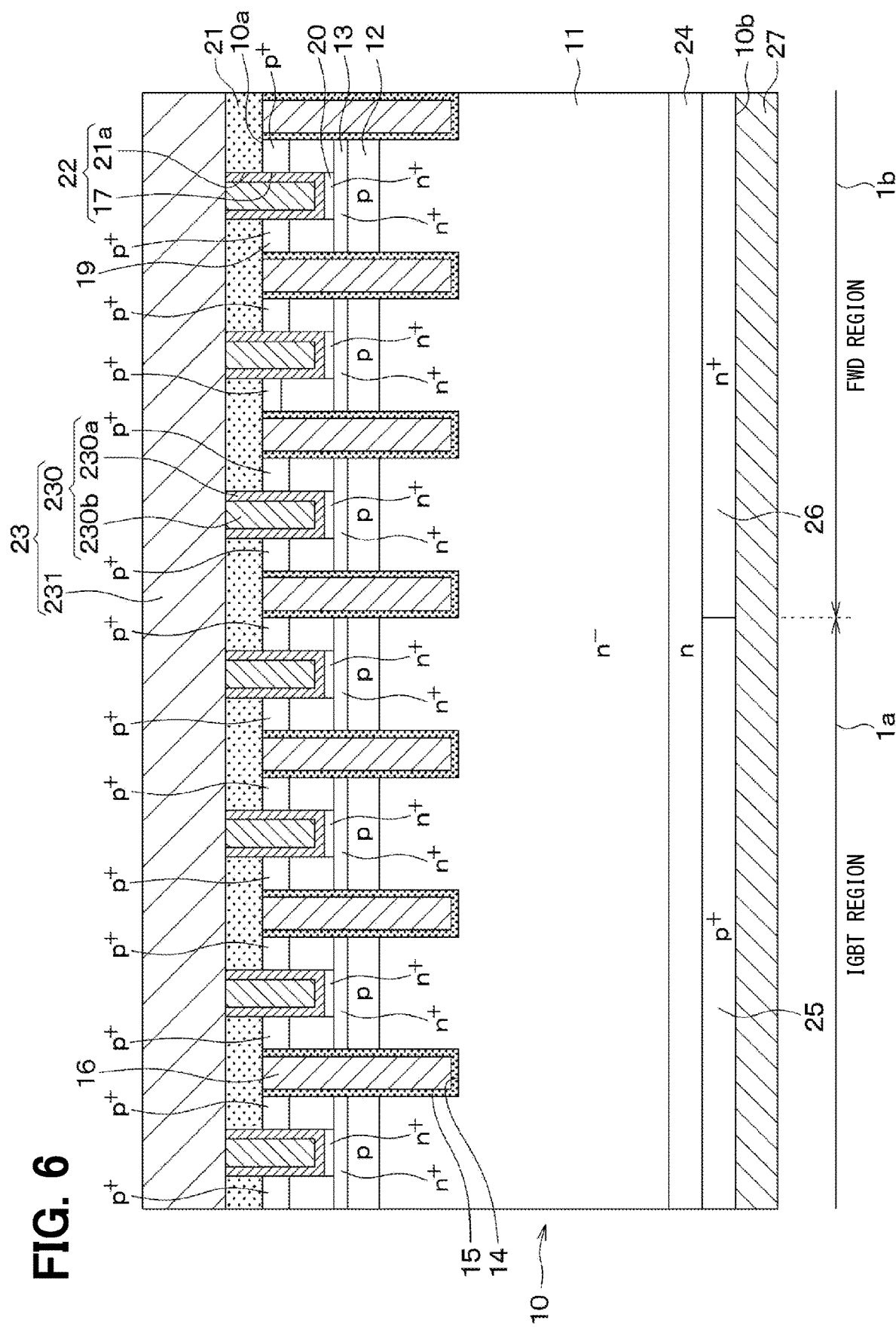
FIG. 6 is a cross-sectional view of a part of the semiconductor device according to the third embodiment, which is different from a part shown in FIG. 5.

In the semiconductor device of the present embodiment, as shown in FIGS. 5 and 6, the emitter region 18 and the contact region 19 are not arranged in the thickness direction of the semiconductor substrate 10, but are arranged as follows. That is, the emitter region 18 and the contact region 19 of the present embodiment are formed so as to be alternately arranged in the longitudinal direction of the gate trench 14 on the first surface 10a of the semiconductor substrate 10. Therefore, in the semiconductor device of the present embodiment, the first surface 10a of the semiconductor substrate 10 is provided with the emitter regions 18 and the contact regions 19. Note that FIG. 5 corresponds to a cross-sectional view taken along line II-II in FIG. 1, and FIG. 6 corresponds to a cross-sectional view taken along line VI-VI in FIG. 1.

Such a semiconductor device is manufactured as follows. That is, ion implantation or the like is performed to the first surface 10a of the semiconductor substrate 10 so as to form the emitter region 18 and the contact region 19. Thereafter, the gate trench 14 and the contact trench 17 are formed. In this way, the semiconductor device of the present embodiment is manufactured.

According to the present embodiment described above, the emitter region 18 and the contact region 19 are arranged in the longitudinal direction of the gate trench 14. Therefore, as compared with the case where the emitter region 18 and the contact region 19 are arranged in the arrangement direction of the gate trenches 14, the distance between the adjacent gate trenches 14 can be easily shortened, and thus the semiconductor device can be miniaturized. Further, the on-resistance can be reduced.

In the present embodiment, the emitter region 18 and the contact region 19 are arranged in the longitudinal direction of the gate trench 14. Therefore, in order to manufacture such a semiconductor device, the ion implantation or the like is performed to the first surface 10a of the semiconductor substrate 10 to form the emitter region 18 and the contact region 19, and then the gate trench 14, the contact trench 17 and the like are formed. In this case, since the ion implantation is performed to the first surface 10a of the semiconductor substrate 10, the concentration of the contact region 19 can be easily controlled, as compared with the case where the ion implantation or the like is performed to the side surface of the contact trench 17 to form the contact region 19. Further, in the semiconductor device of the present embodiment, even if the misalignment between the gate trench 14 and the contact trench 17 occurs, the overall misalignment can be made small, as compared with the case where the contact region 19 is formed after forming the contact trench 17. As such, variations in characteristics can be reduced.

Fourth Embodiment

A fourth embodiment will be described hereinafter. In the present embodiment, the shape of the connecting trench 22 is changed from that of the third embodiment. The other configurations are the same as those of the third embodiment, and therefore a description of the same configurations will be omitted below.

Figure 7:
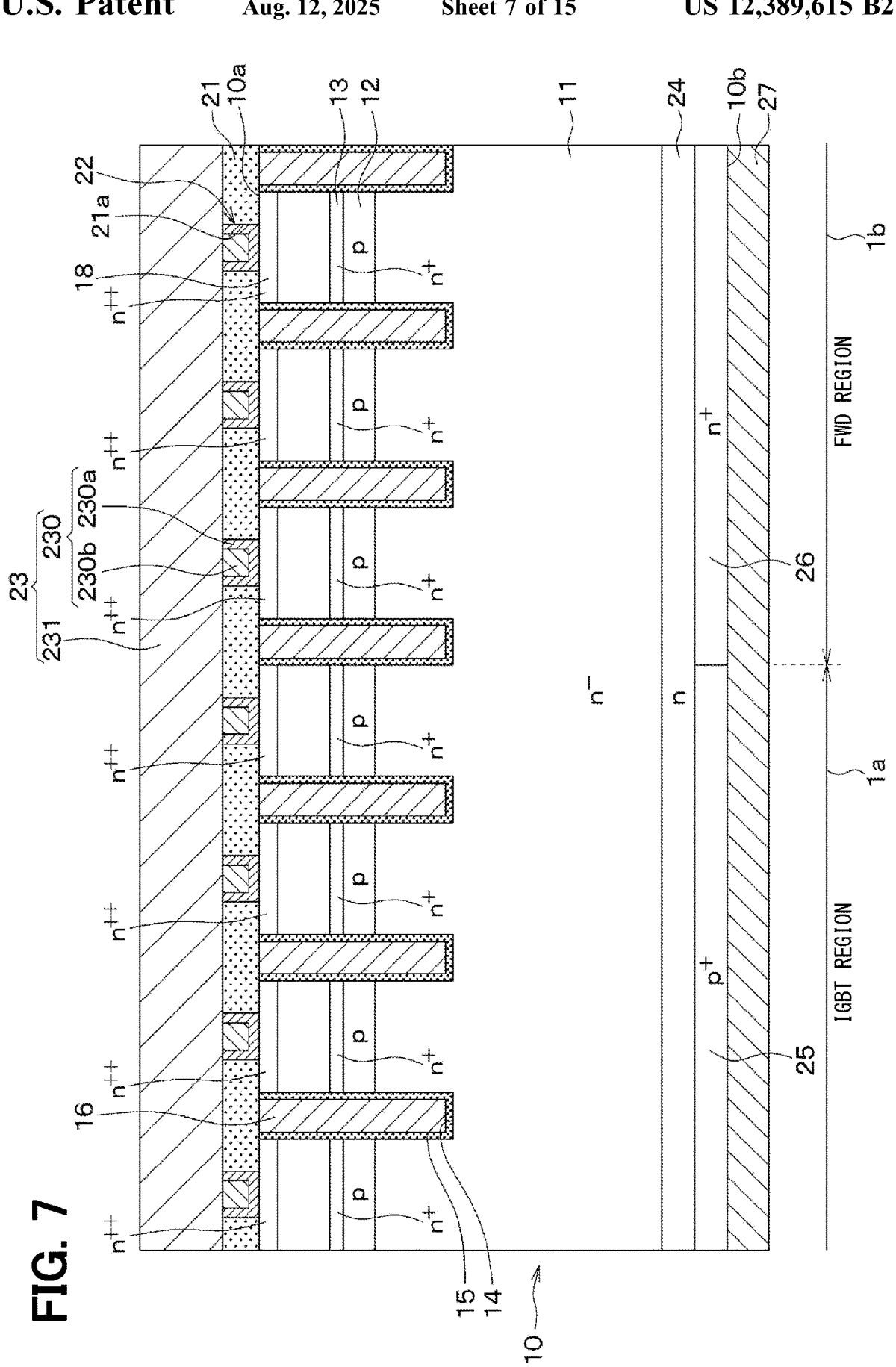
FIG. 7 is a cross-sectional view of a semiconductor device according to a fourth embodiment of the present disclosure.
Figure 8:
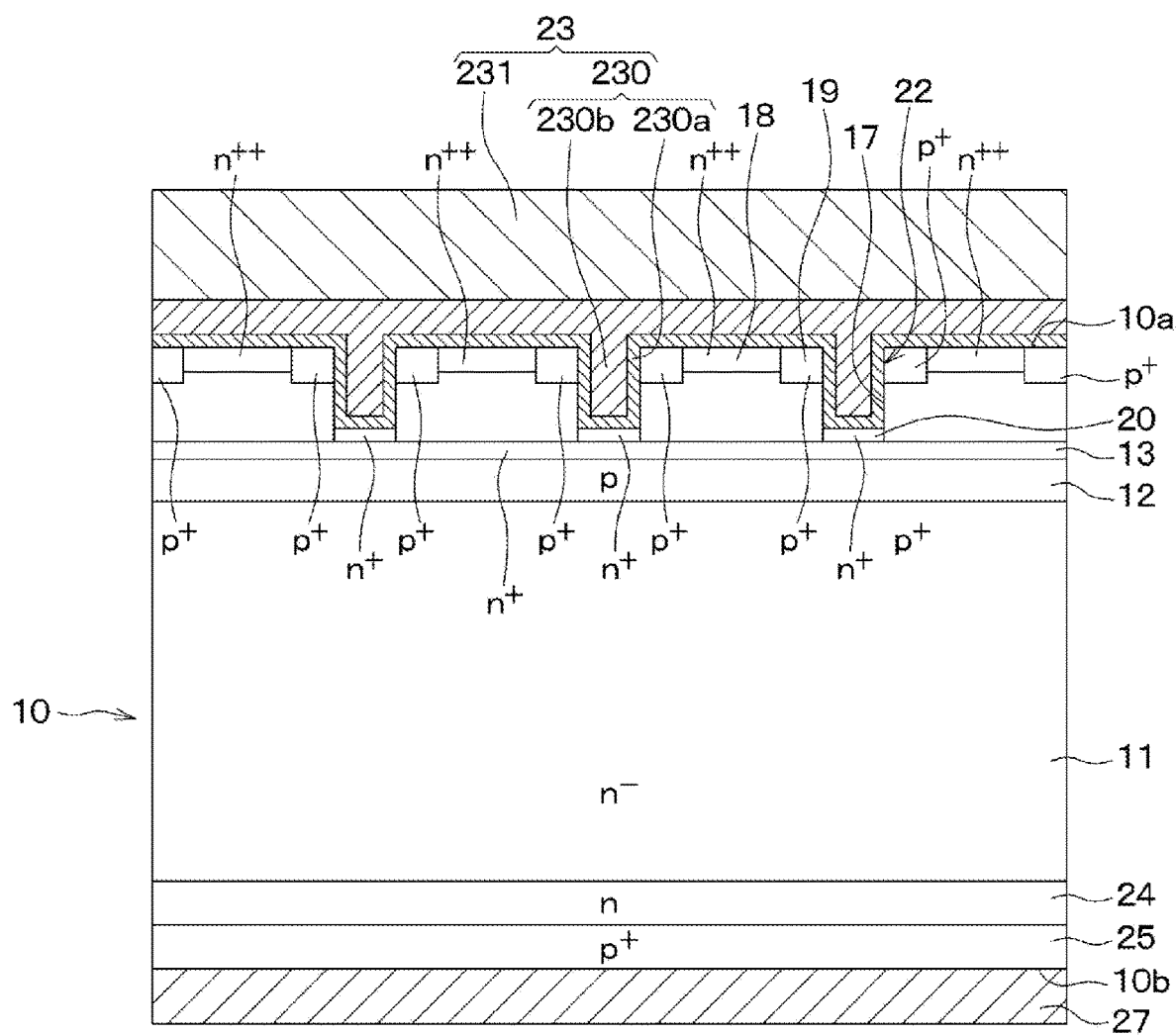
FIG. 8 is a cross-sectional view of a part of the semiconductor device according to the fourth embodiment, which is different from a part shown in FIG. 7.

In the semiconductor device of the present embodiment, as shown in FIGS. 7 and 8, the contact trench 17 is thinned out in the longitudinal direction of the gate trench 14. In other words, the contact trench 17 is partially formed in the longitudinal direction of the gate trench 14. That is, the contact trench 17 is formed so as to be scattered or discontinuous in the longitudinal direction of the gate trench 14. Note that FIG. 7 corresponds to a cross-sectional view taken along the line II-II in FIG. 1, and FIG. 8 is a cross-sectional view taken along the line VIII-VIII in FIG. 1.

Specifically, the emitter region 18 and the contact region 19 are formed so as to be alternately arranged in the longitudinal direction of the gate trench 14, as in the third embodiment. The contact trench 17 is formed so as to penetrate each contact region 19, but not to penetrate the emitter region 18. Therefore, in the contact region 19, a portion exposed from the first surface 10a of the semiconductor substrate 10 is also connected to the upper electrode 23. In the present embodiment, the barrier metal portion 230a is also formed in the portion between the adjacent contact trenches 17 on the first surface 10a of the semiconductor substrate 10.

According to the present embodiment described above, since the emitter region 18 and the contact region 19 are arranged in the longitudinal direction of the gate trench 14, the same effect as that of the third embodiment can be obtained.

According to the present embodiment, the portion of the contact region 19 exposed from the first surface 10a of the semiconductor substrate 10 is also connected to the upper electrode 23. Therefore, as compared with the case where the contact region 19 is connected to the upper electrode 23 only on the side surface of the contact trench 17 and is formed by performing the ion implantation to the first surface 10a of the semiconductor substrate 10 as in the third embodiment, the surface density of the contact region 19 relative to the upper electrode 23 can be increased. As such, the ohmic connection between the contact region 19 and the upper electrode 23 can be easily secured. Further, since the ohmic connection between the contact region 19 and the upper electrode 23 is easily secured, it is possible to suppress the potential of the portion of the base layer 12 located directly below the emitter region 18 from rising, and thus the latch-up resistance is improved.

Fifth Embodiment

A fifth embodiment will be described hereinafter. In the present embodiment, the shape of the contact region 19 is changed from that of the fourth embodiment. The other configurations are the same as those of the fourth embodiment, and therefore a description of the same configurations will be omitted below.

Figure 9:
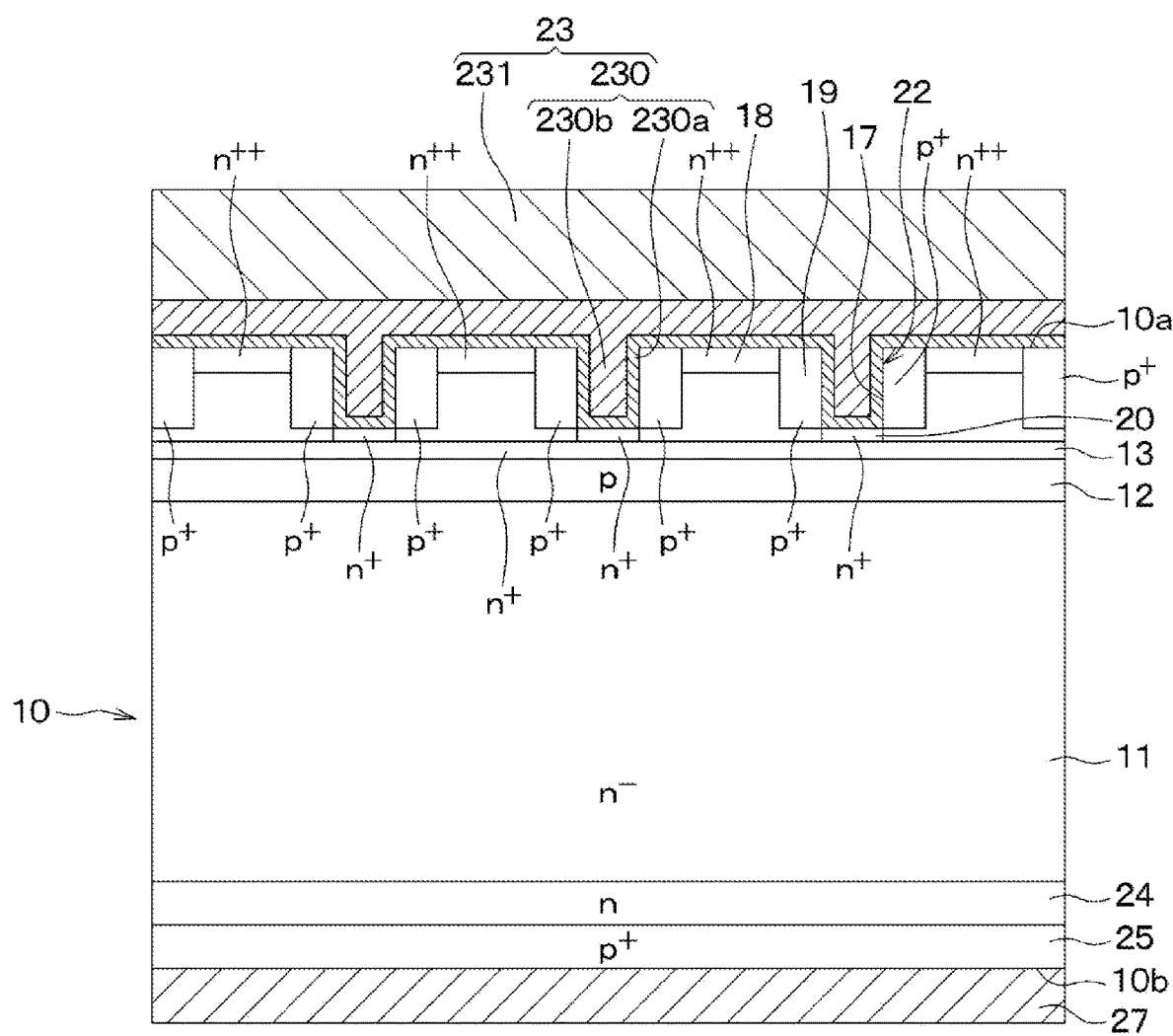
FIG. 9 is a cross-sectional view of a semiconductor device according to a fifth embodiment of the present disclosure.

In the semiconductor device of the present embodiment, as shown in FIG. 9, the contact region 19 is formed to have the same depth as the contact trench 17. Note that FIG. 9 corresponds to a cross-sectional view taken along the line VIII-VIII in FIG. 1.

According to the present embodiment described above, since the emitter region 18 and the contact region 19 are arranged in the longitudinal direction of the gate trench 14, the same effect as that of the third embodiment can be obtained.

According to the present embodiment, the contact region 19 is formed to be the same depth as the contact trench 17. Therefore, the connection area between the contact region 19 and the upper electrode 23 can be further increased, and the same effect as that of the fourth embodiment can be obtained. Further, since the ohmic connection between the contact region 19 and the upper electrode 23 can be easily secured, the distance between the contact regions 19 in the longitudinal direction of the gate trench 14 can be shortened. Moreover, the potential of the barrier region 13 can be stabilized.

Sixth Embodiment

A sixth embodiment will be described hereinafter. The present embodiment is a combination of the first embodiment and the fifth embodiment. The other configurations are the same as those of the first embodiment and the fifth embodiment, and thus the description thereof will be omitted below.

Figure 10:
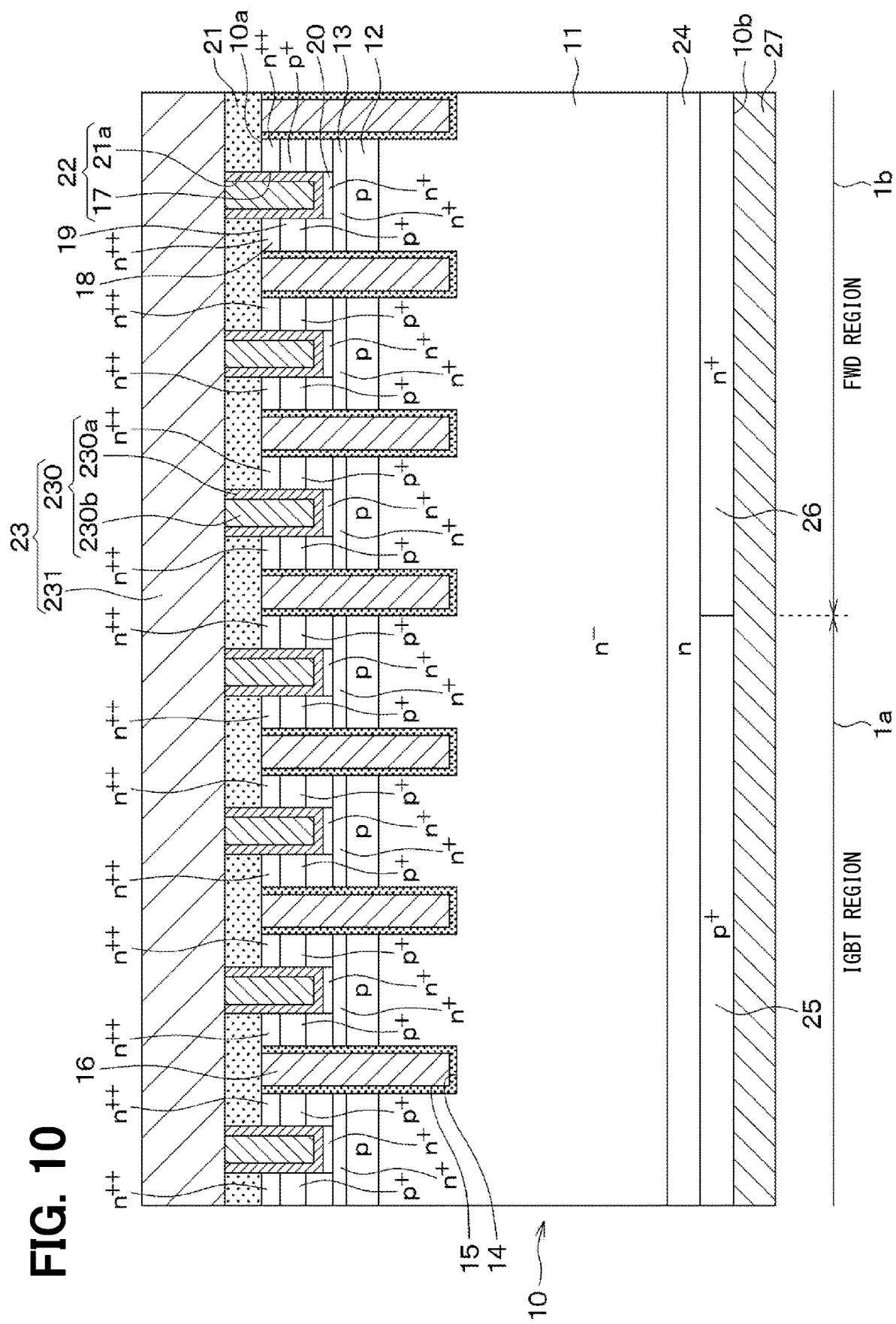
FIG. 10 is a cross-sectional view of a semiconductor device according to a sixth embodiment of the present disclosure.
Figure 11:
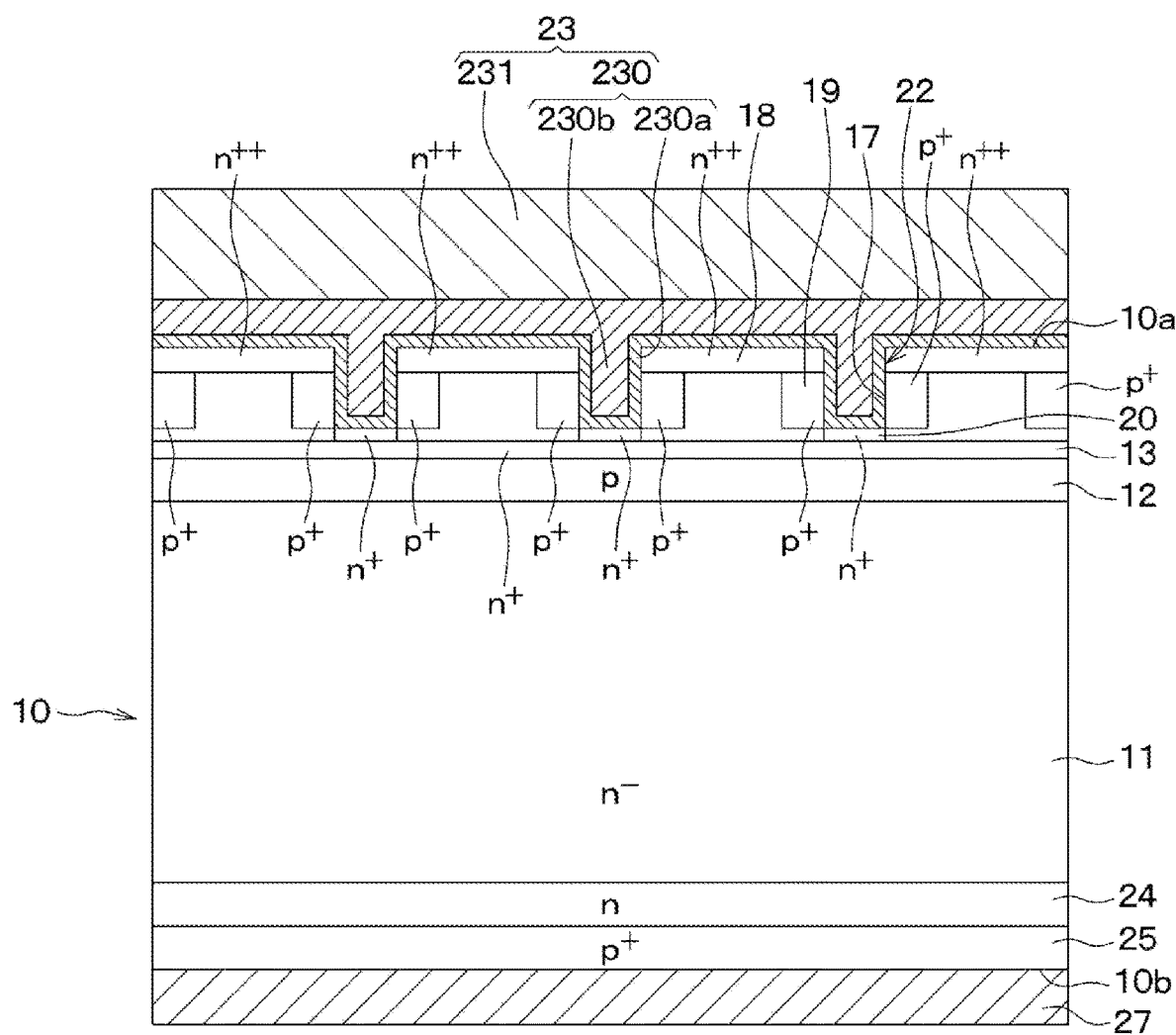
FIG. 11 is a cross-sectional view of a part of the semiconductor device according to the sixth embodiment, which is different from a part shown in FIG. 10.

In the semiconductor device of the present embodiment, as shown in FIGS. 10 and 11, the contact trench 17 is formed by thinning out in the longitudinal direction of the gate trench 14. Note that FIG. 10 corresponds to a cross-sectional view taken along the line II-II in FIG. 1, and FIG. 11 corresponds to a cross-sectional view taken along the line VIII-VIII in FIG. 1.

The emitter region 18 is formed entirely over the first surface 10a of the semiconductor substrate 10. The contact region 19 is formed below the emitter region 18 so as to be in contact with the side surface of the contact trench 17. The contact region 19 has the same depth as the contact trench 17.

According to the present embodiment described above, since the emitter region 18 and the contact region 19 are arranged in the thickness direction of the semiconductor substrate 10, the same effect as that of the first embodiment can be obtained.

In the present embodiment, since the contact region 19 is formed to the same depth as the contact trench 17, the same effect as that of the fifth embodiment can be obtained.

Seventh Embodiment

A seventh embodiment will be described hereinafter. In the present embodiment, the formation position of the semiconductor device is specified with respect to the configuration of the first embodiment. The other configurations are the same as those of the first embodiment, and therefore a description of the same configurations will be omitted below.

Figure 12:
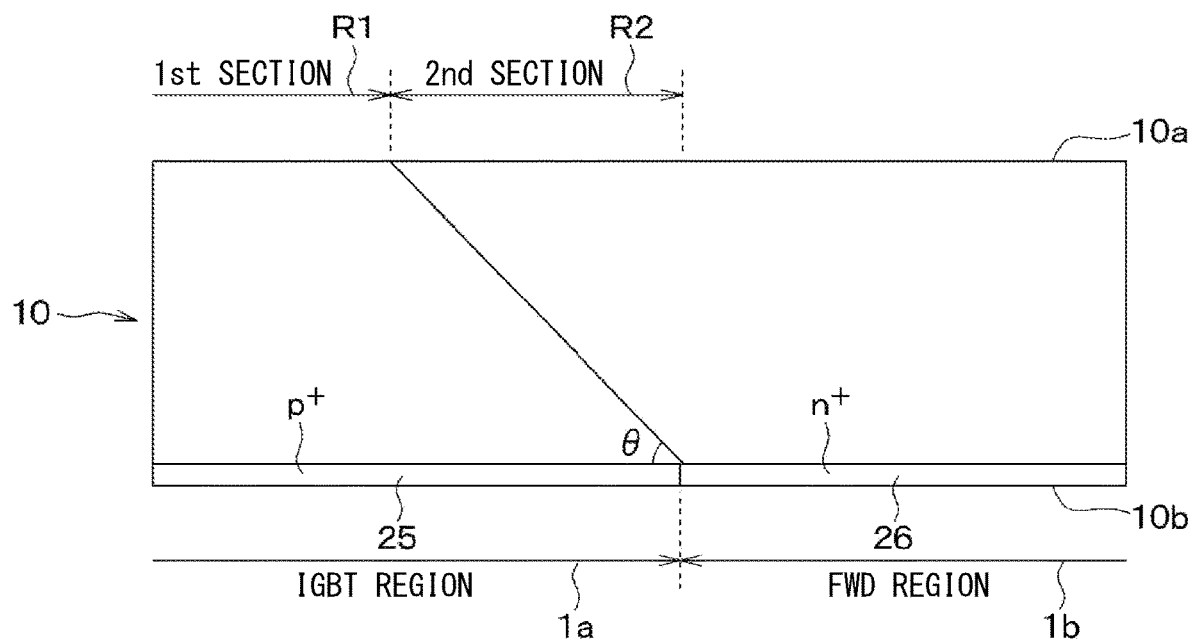
FIG. 12 is a schematic diagram showing a part through which a current flows, when an FWD element is in an on state, in a semiconductor device according to a seventh embodiment.

In the semiconductor device provided with the RC-IGBT, when the FWD element is in the on state, as shown in FIG. 12, the current flows as follows with reference to a boundary portion between the IGBT region 1a and the FWD region 1b. That is, the current flows from the boundary portion on the second surface 10b toward the IGBT region 1a with the angle θ relative to the second surface 10b of the semiconductor substrate 10 being about 45°. Therefore, the portion of the IGBT region 1a adjacent to the FWD region 1b in which the current flows when the FWD element is in the on state affects the recovery loss. In the present embodiment, the portion of the IGBT region 1a that affects the recovery loss (that is, the region in which the current flows when the FWD element is in the on state) is referred to as a second section R2. Further, a portion of the IGBT region 1a that is different from the second section R2 is referred to as a first section R1.

In the semiconductor device of the present embodiment, the second section R2 has the same configuration as the IGBT region 1a described in the first embodiment.

Figure 13:
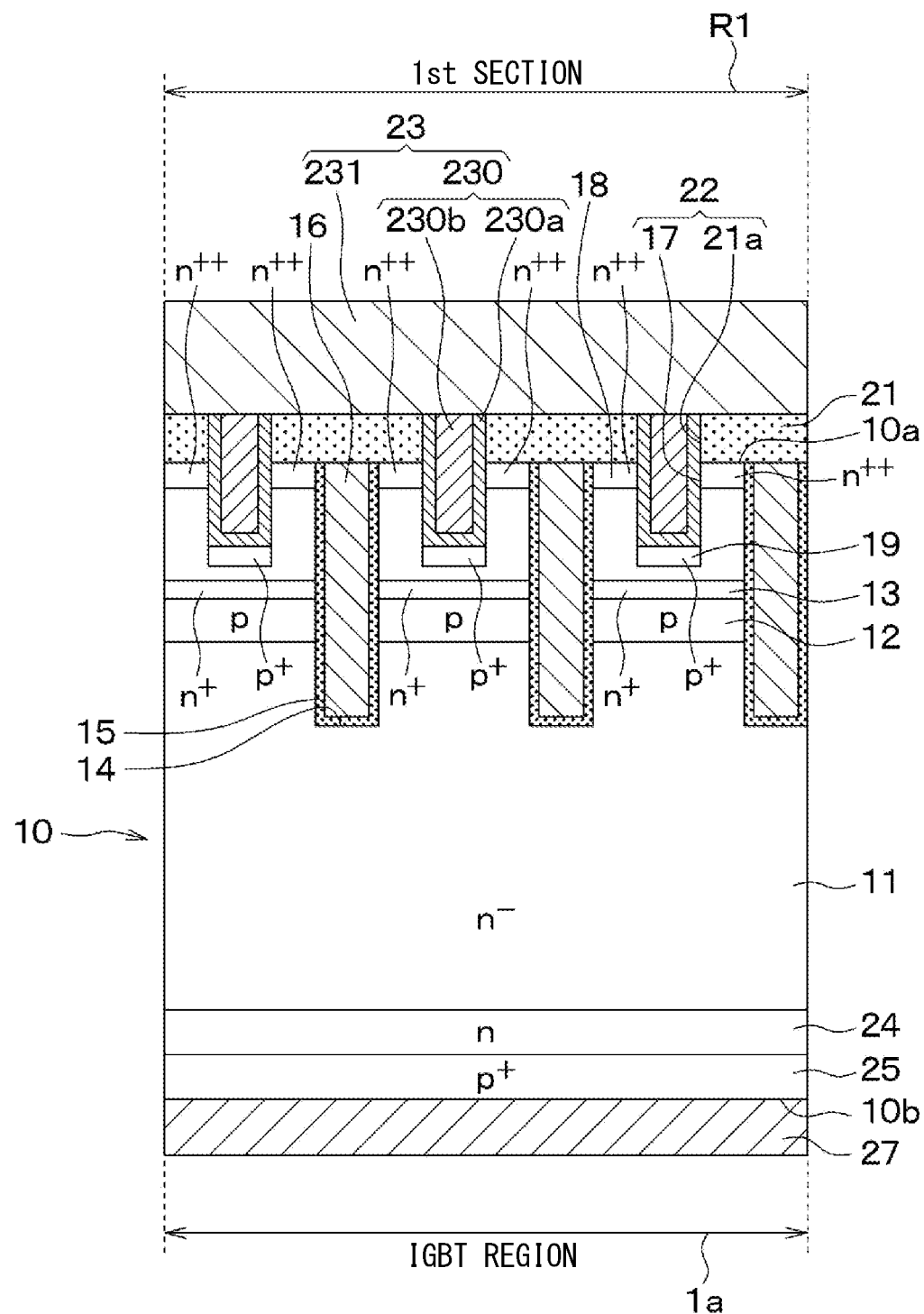
FIG. 13 is a cross-sectional view of a first section of the IGBT region according to the seventh embodiment.

On the other hand, in the semiconductor device of the present embodiment, as shown in FIG. 13, the first section R1 is not formed with the connecting region 20 to be in contact with the bottom surface of the contact trench 17. In the first section R1, the contact region 19 is formed to be in contact with the bottom surface of the contact trench 17. According to this, the contact region 19 can be formed by ion implantation or the like into the bottom surface of the contact trench 17. Therefore, the concentration of the contact region 19 can be easily controlled, as compared with the case where the contact region 19 is formed so as to be in contact with the side surface of the contact trench 17. Although not particularly shown, the contact region 19 is formed so as to be also in contact with the side surface of the gate trench 14. Further, the distance between the adjacent gate trenches 14 may be different between the first section R1 and the second section R2. For example, the distance between the adjacent gate trenches 14 in the first section R1 may be larger than that in the second section R2.

As in the present embodiment described above, the IGBT region 1a may have a different configuration between the first section R1 and the second section R2, and the second section R2 may have the same configuration as the IGBT region 1a of the first embodiment.

Modification of Seventh Embodiment

Figure 14:
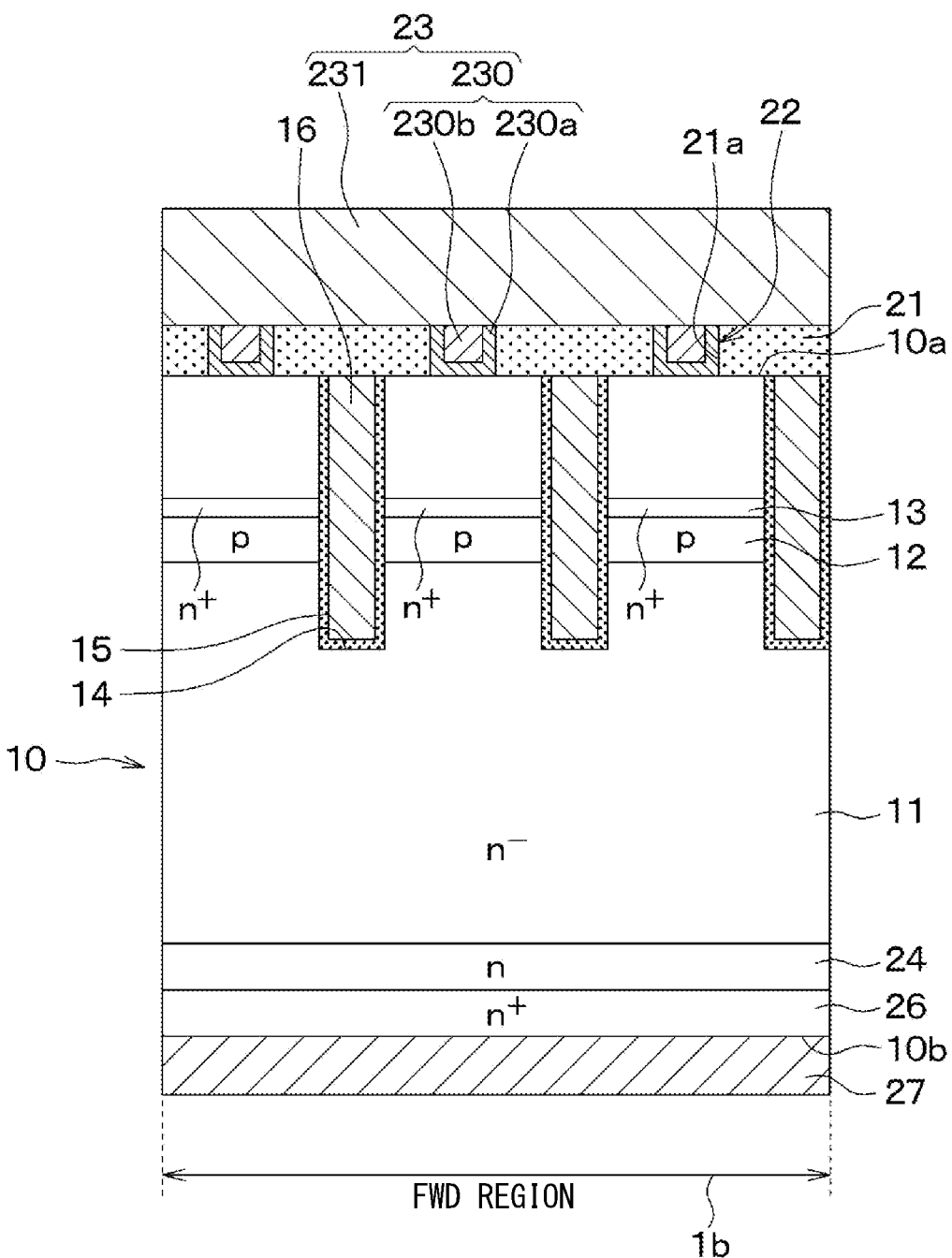
FIG. 14 is a cross-sectional view of an FWD region of a semiconductor device according to a modification of the seventh embodiment.
Figure 15:
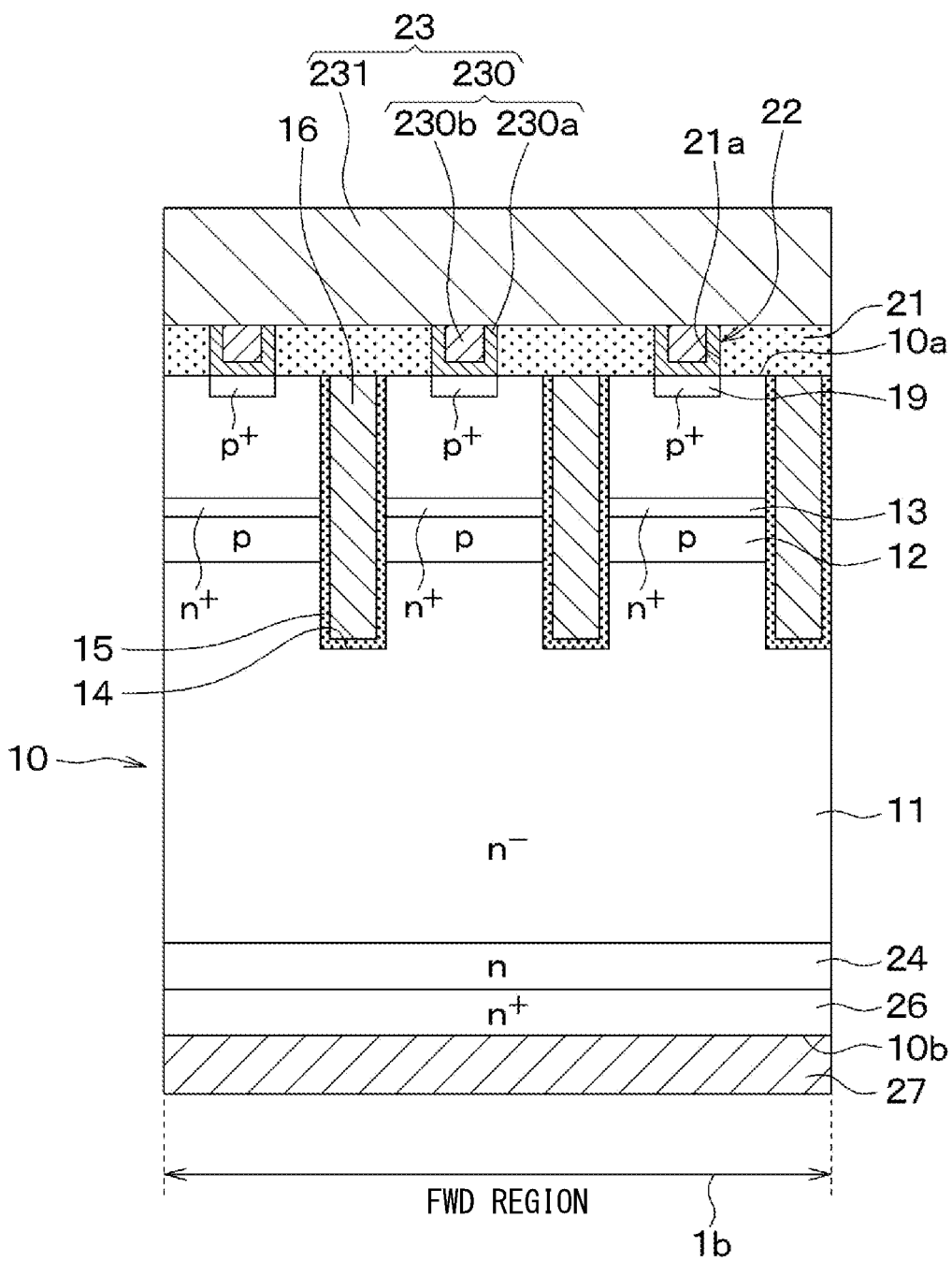
FIG. 15 is a cross-sectional view of the FWD region of the semiconductor device according to the modification of the seventh embodiment.

A modification of the seventh embodiment will be described hereinafter. In the present embodiment, the second section R2 of the IGBT region 1a may have the same configuration as the IGBT region 1a of the third to sixth embodiments. As shown in FIGS. 14 and 15, the FWD region 1b may not be formed with the contact trench 17 and the connecting region 20. In the surface layer portion of the base layer 12, the contact region 19 connected to the upper electrode 23 may be formed partially in the longitudinal direction of the gate trench 14. Note that FIG. 14 corresponds to a cross-sectional view taken along the line XVI-XVI in FIG. 1, and FIG. 15 corresponds to a cross-sectional view taken along the line XV-XV in FIG. 1. Further, although not particularly shown, the configuration of the FWD region 1b can be appropriately changed. For example, the gate trench 14 may not be formed or the emitter region 18 may not be formed.

Other Embodiments

Although the present disclosure has been described in accordance with the embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, are within the scope and spirit of the present disclosure.

For example, in each of the embodiments described above, the example in which the first conductivity type is the n type and the second conductivity type is the p type has been described. Alternatively, the first conductivity type may be the p type and the second conductivity type may be the n type.

In each of the embodiments described above, the number of the cell region 1 may be one, or may be three or more. Further, only one FWD region 1b may be formed in one cell region 1.

The embodiments described above can be combined as appropriate. For example, in the first, third to sixth embodiments, the configuration of the FWD region 1b may be the same configuration as the second embodiment or the seventh embodiment, or may be another configuration. Further, the combinations of the above embodiments may be further combined. That is, the embodiments described above may be combined in various ways.

What is claimed is:

1. A semiconductor device comprising:
a semiconductor substrate including an IGBT region having an IGBT element and a FWD region having an FWD element, the semiconductor substrate having a first conductivity type drift layer, a second conductivity type base layer disposed on the drift layer, a second conductivity type collector layer disposed opposite to the base layer with respect to the drift layer in the IGBT region, and a first conductivity type cathode layer disposed opposite to the base layer with respect to the drift layer in the FWD region, the semiconductor substrate having a first surface adjacent to the base layer and a second surface opposite to the first surface and adjacent to the collector layer and the cathode layer;
a gate insulating film disposed on a wall surface of each of a plurality of gate trenches disposed in the semiconductor substrate in the IGBT region, each of the plurality of gate trenches passing through the base layer to reach the drift layer and extending in one direction as a longitudinal direction along a planar direction of the semiconductor substrate, the plurality of gate trenches being arranged in an arrangement direction that intersects with the longitudinal direction;
a gate electrode disposed on the gate insulating film;
a first conductivity type emitter region disposed in a surface layer portion of the base layer in the IGBT region to be in contact with each of the gate trenches, the emitter region having a higher impurity concentration than the drift layer;
a second conductivity type contact region disposed in the base layer in the IGBT region, the contact region having a higher impurity concentration than the base layer;
a first electrode disposed adjacent to the first surface of the semiconductor substrate, the first electrode being electrically connected to the base layer and the emitter region;
a second electrode disposed adjacent to the second surface of the semiconductor substrate, the second electrode being electrically connected to the collector layer and the cathode layer; and
a first conductivity type barrier region disposed above the drift layer in the IGBT region, the barrier region having a higher impurity concentration than the drift layer, wherein
the semiconductor substrate is formed with a contact trench between adjacent gate trenches in the IGBT region, the contact trench having a bottom surface closer to the first surface of the semiconductor substrate than the barrier region is to the first surface, the first electrode is embedded in the contact trench, the semiconductor device further comprising:

a first conductivity type connecting region between the bottom surface of the contact trench and the barrier region in the IGBT region, the connecting region being connected to the barrier region and the first electrode and having a higher impurity concentration than the drift layer, wherein the emitter region and the contact region are arranged in a direction different from the arrangement direction.

2. The semiconductor device according to claim 1, wherein the emitter region is disposed to be exposed from the first surface of the semiconductor substrate, the contact region is disposed to be exposed from a side surface of the contact trench in a position between the emitter region and the barrier region, and the contact region and the emitter region are arranged in a thickness direction of the semiconductor substrate.

3. The semiconductor device according to claim 1, wherein the emitter region and the contact region are alternately arranged in the longitudinal direction.

4. The semiconductor device according to claim 1 wherein the contact trench is extended in the longitudinal direction.

5. The semiconductor device according to claim 1, wherein the contact trench is disposed partially in the longitudinal direction.

6. The semiconductor device according to claim 1, wherein the contact region has a same depth as the contact trench.

7. The semiconductor device according to claim 1, wherein the emitter region and the contact region are arranged in a thickness direction of the semiconductor substrate so that a bottom of the contact region is located lower than a bottom of the emitter region.

8. The semiconductor device according to claim 1, wherein the emitter region and the contact region are arranged in the longitudinal direction.

* * * * *